(12) United States Patent
Takano et al.

US009365693B2

(10) Patent No.: US 9,365,693 B2
(45) Date of Patent: Jun. 14, 2016

(54) THERMOPLASTIC RESIN COMPOSITION, RESIN ARTICLE, AND METHOD OF MANUFACTURING RESIN ARTICLE WITH PLATED LAYER

(71) Applicant: MITSUBISHI ENGINEERING-PLASTICS CORPORATION, Tokyo (JP)

(72) Inventors: Takahiro Takano, Hiratsuka (JP); Takahiko Sumino, Hiratsuka (JP); Kentarou Ishihara, Hiratsuka (JP)

(73) Assignee: MITSUBISHI ENGINEERING-PLASTICS CORPORATION, Tokyo (JP)

( * ) Notice: Subject to any disclaimer, the term of this patent is extended or adjusted under 35 U.S.C. 154(b) by 71 days.

(21) Appl. No.: 14/129,183

(22) PCT Filed: Mar. 15, 2013

(86) PCT No.: PCT/JP2013/057431
§ 371 (c)(1),
(2) Date: Dec. 24, 2013

(87) PCT Pub. No.: WO2013/141157
PCT Pub. Date: Sep. 26, 2013

(65) Prior Publication Data
US 2014/0147682 A1    May 29, 2014

(30) Foreign Application Priority Data

Mar. 23, 2012 (JP) ................................ 2012-068281

(51) Int. Cl.
| | | |
|---|---|---|
| C08K 3/00 | (2006.01) |
| C08K 7/14 | (2006.01) |
| C08K 3/40 | (2006.01) |
| C08L 77/06 | (2006.01) |
| C23C 18/38 | (2006.01) |
| C23C 18/42 | (2006.01) |
| C23C 18/32 | (2006.01) |
| H05K 1/03 | (2006.01) |
| C08K 3/22 | (2006.01) |
| C08K 9/02 | (2006.01) |
| H05K 3/10 | (2006.01) |
| F21V 7/22 | (2006.01) |
| C23C 18/16 | (2006.01) |
| C23C 18/20 | (2006.01) |
| C08L 101/12 | (2006.01) |

(52) U.S. Cl.
CPC ... *C08K 3/00* (2013.01); *C08K 3/22* (2013.01); *C08K 3/2279* (2013.01); *C08K 3/40* (2013.01); *C08K 7/14* (2013.01); *C08K 9/02* (2013.01); *C08L 77/06* (2013.01); *C08L 101/12* (2013.01); *C23C 18/1608* (2013.01); *C23C 18/1612* (2013.01); *C23C 18/1641* (2013.01); *C23C 18/204* (2013.01); *C23C 18/32* (2013.01); *C23C 18/38* (2013.01); *C23C 18/42* (2013.01); *F21V 7/22* (2013.01); *H05K 1/0373* (2013.01); *H05K 3/105* (2013.01); *C08K 2003/2231* (2013.01); *C08K 2003/2241* (2013.01); *H05K 2201/0129* (2013.01); *H05K 2201/0209* (2013.01); *H05K 2201/0221* (2013.01); *H05K 2201/0245* (2013.01); *H05K 2201/0254* (2013.01); *H05K 2201/0293* (2013.01); *H05K 2201/0347* (2013.01); *H05K 2201/09118* (2013.01); *H05K 2201/10106* (2013.01); *H05K 2201/2054* (2013.01); *H05K 2203/0723* (2013.01); *H05K 2203/107* (2013.01)

(58) Field of Classification Search
None
See application file for complete search history.

(56) References Cited

U.S. PATENT DOCUMENTS

| | | | |
|---|---|---|---|
| 4,018,746 A * | 4/1977 | Brinkmann | C08G 69/265 528/338 |
| 2004/0241422 A1 | 12/2004 | Naundorf et al. | |
| 2006/0083939 A1 | 4/2006 | Dunbar et al. | |
| 2009/0088507 A1 | 4/2009 | Ogasawara | |
| 2009/0292051 A1 * | 11/2009 | Li et al. | 524/404 |
| 2013/0143994 A1 | 6/2013 | Van Hartingsveldt et al. | |

FOREIGN PATENT DOCUMENTS

| | | | |
|---|---|---|---|
| EP | 2 233 519 A1 | 9/2010 |
| JP | 8-81639 A | 3/1996 |
| JP | 9-12776 A | 1/1997 |
| JP | 10-500149 A | 1/1998 |
| JP | 2000-503817 A | 3/2000 |
| JP | 2004-75994 A | 3/2004 |

(Continued)

OTHER PUBLICATIONS

International Search Report, mailed Apr. 23, 2013, issued in PCT/JP2013/057431.

(Continued)

*Primary Examiner* — Sheeba Ahmed
(74) *Attorney, Agent, or Firm* — Birch, Stewart, Kolasch & Birch, LLP

(57) ABSTRACT

Provided is a thermoplastic resin composition which is excellent in platability (appearance of plating), and keeps high reflectance even after thermal aging. A thermoplastic resin composition comprising: per (A) 100 parts by weight of a crystalline thermoplastic resin having a melting point, measured by differential scanning calorimetry (DSC) at a heating rate of 10° C./min, of 250° C. or above; (B) 10 to 80 parts by weight of a glass filler; (C) 1 to 30 parts by weight of a laser direct structuring additive having a reflectance at 450 nm of 25% or above; and (D) 20 to 150 parts by weight of titanium oxide.

24 Claims, 1 Drawing Sheet

(56) References Cited

FOREIGN PATENT DOCUMENTS

| | | |
|---|---|---|
| JP | 2004-534408 A | 11/2004 |
| JP | 2006-124701 A | 5/2006 |
| JP | 101155878 A | 4/2008 |
| JP | 101784607 A | 7/2010 |
| JP | 2010-274530 A | 12/2010 |
| JP | 2010-536947 A | 12/2010 |
| JP | 102066473 A | 5/2011 |
| WO | WO 95/30546 A1 | 11/1995 |
| WO | WO 99/05895 A1 | 2/1999 |
| WO | WO 2009/141799 A1 | 11/2009 |
| WO | WO 2009/141800 A2 | 11/2009 |
| WO | WO 2012/128219 A1 | 12/2010 |

OTHER PUBLICATIONS

John Wolfgang, "Technology report", Industrial Laser Solutions Japan, pp. 18-22, Sep. 2011.
Notice of Allowance issued on Jul. 30, 2013 in corresponding JP Application No. 2012-068281.
Chinese Office Action and Search Report, issued Jan. 22, 2015, for Chinese Application No. 201380001611.1, along with an English translation of the Chinese Office Action.
Supplementary European Search Report dated Mar. 14, 2014, issued in corresponding European Patent Application No. 13764808.5.
International Preliminary Report on Patentability dated Sep. 23, 2014, issued in PCT/JP2013/057431 (Forms PCT/IB/373, PCT/ISA/237, PCT/IB/338 and PCT/IB/373).

* cited by examiner

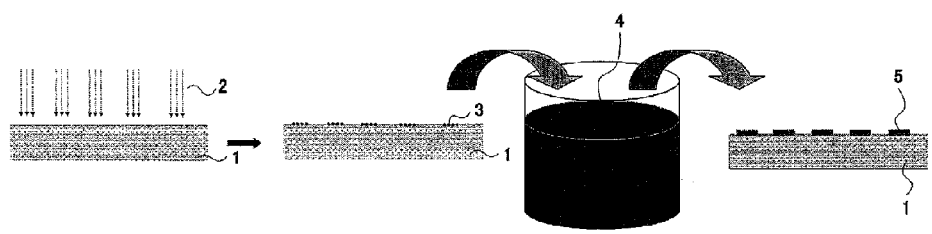

THERMOPLASTIC RESIN COMPOSITION, RESIN ARTICLE, AND METHOD OF MANUFACTURING RESIN ARTICLE WITH PLATED LAYER

TECHNICAL FIELD

The present invention relates to a thermoplastic resin composition, and in particular to a thermoplastic resin composition for laser direct structuring. The present invention also relates to a resin article obtained by forming the thermoplastic resin composition, and, a method of manufacturing a resin article with a plated layer, having a plated layer formed on the surface of the resin article.

BACKGROUND ART

In recent years, new light sources such as light emitting diode (LED), organic EL and so forth have been expanding demands as lighting and display devices, making the best use of advantages in low power consumption and long life. In particular, LED has been used in a variety of applications including mobile communication devices such as mobile phone, display, vehicle console panel, traffic light, and other home electric appliances. In these sorts of electric and electronic appliances, pursuit of lighter weight and smaller size is an accelerated trend mainly for the requirements of designability and portability.

Surface mounting technology (SMT), known as a key technology for implementing the weight reduction and downsizing, has been disseminated and applied to a number of electric and electronic appliances. By virtue of the technology, mounting density on electronic circuit board has sharply been increased, and the weight reduction and downsizing have been implemented to a degree which could not be reached before.

When the SMT is applied, the whole parts mounted on the electronic circuit board are soldered en bloc, so that all materials used therefor have to be resistant to soldering temperature (230 to 240° C.). Heat resistant resin composition is known as a material suitable for this sort of application (see Patent Literature 1, for example).

Laser direct structuring (occasionally referred to as "LDS", hereinafter) has attracted public attention as one plating technique capable of enabling three-dimensional design directly onto LED or the like. The LDS is a technique of typically irradiating laser light onto the surface of a resin article which contains an LDS additive so as to activate only the portion irradiated by the laser light, and applying a metal to the activated portion to thereby form thereon a plated layer. The technique is characterized by that a metal structure may be formed directly onto the surface of a resin base, without using an adhesive or the like. The LDS technique is disclosed, for example, in Patent Literatures 2 to 4.

CITATION LIST

Patent Literature

[Patent Literature 1] JP-A-2004-075994
[Patent Literature 2] Published Japanese Translation of PCT International Publication for Patent Application No. 2000-503817
[Patent Literature 3] Published Japanese Translation of PCT International Publication for Patent Application No. 2004-534408
[Patent Literature 4] International Patent Publication WO2009/141800, Pamphlet

SUMMARY OF THE INVENTION

Technical Problem

LED is generally configured by a semiconductor section which emits light, lead wires, a reflector which also serves as a housing, and a translucent sealant for sealing the semiconductor section. Among them, while the reflector portion has been commercialized using a variety of materials including ceramic and heat resistant resin composition, the ceramic is suffering from poor productivity, and the heat resistant resin composition is suffering from lowered light reflectance due to color change which possibly occurs in the processes of injection molding, heat curing of the sealant, and under environments of practical use. The heat resistant resin composition, in the process of molding, is also required to be added with a glass filler, from the viewpoint of improving mechanical strength and dimensional accuracy.

It is therefore an object of the present invention to provide a resin composition which satisfies the requirements described above and solves the problems, and to provide a thermoplastic resin composition which contains a glass filler, and, is highly resistant to heat of solder, excellent in platability (appearance of plating), and keeps high reflectance even after thermal aging.

Solution to Problem

In this circumstance, the present inventor found out from our thorough investigations that, when a specific thermoplastic resin, a glass filler, and a specific LDS additive were used, the resin composition was successfully improved in the platability while keeping a high level of reflectance, by adding titanium oxide. The present inventors also found out that the thermoplastic resin composition which satisfies the requirements is providable, by thoroughly examining, for example, amounts of addition of the individual components. The findings led us to complete the present invention.

More specifically, the problems described above were solved by means <1> below, and preferably by means <2> to <25> below:

<1> A thermoplastic resin composition comprising:
  per (A) 100 parts by weight of a crystalline thermoplastic resin having a melting point, measured by differential scanning calorimetry (DSC) at a heating rate of 10° C./min, of 250° C. or above;
  (B) 10 to 80 parts by weight of a glass filler;
  (C) 1 to 30 parts by weight of a laser direct structuring additive having a reflectance at 450 nm of 25% or above; and
  (D) 20 to 150 parts by weight of titanium oxide.
<2> The thermoplastic resin composition of <1>,
  wherein the (A) crystalline thermoplastic resin is a polyamide resin.
<3> The thermoplastic resin composition of <1> or <2>,
  wherein the (C) laser direct structuring additive contains antimony and tin.
<4> The thermoplastic resin composition of <1> or <2>,
  wherein the (C) laser direct structuring additive contains antimony and tin, with a content of tin larger than that of antimony.
<5> The thermoplastic resin composition of <1> or <2>,
  wherein the (C) laser direct structuring additive contains antimony and tin oxide, with a content of tin larger than that of antimony.

<6> The thermoplastic resin composition of <1> or <2>,
wherein the (C) laser direct structuring additive has a core composed of a composition having a reflectance at 450 nm of 50% or above, and has a coating composed of a composition containing antimony and tin, with a content of tin larger than that of antimony, formed on a part of, or over the entire surface of the core.
<7> The thermoplastic resin composition of <6>,
wherein the composition composing the core contains a metal oxide.
<8> The thermoplastic resin composition of any one of <1> to <7>,
further comprising 1 to 20 parts by weight of talc per 100 parts by weight of the thermoplastic resin composition.
<9> The thermoplastic resin composition of any one of <1> to <8>,
wherein the (D) titanium oxide has an average primary particle size of 1 μm or smaller.
<10>. The thermoplastic resin composition of any one of <1> to <9>,
wherein the (D) titanium oxide has the rutile structure.
<11> The thermoplastic resin composition of any one of <1> to <10>,
wherein the (B) glass filler is at least one material selected from chopped fiber, milled fiber, flake, bead and balloon.
<12> The thermoplastic resin composition of any one of <1> to <11>,
wherein the (B) glass filler is E-glass.
<13> The thermoplastic resin composition of any one of <1> to <12>, further comprising 0.01 to 5 parts by weight of an organic or/and inorganic heat stabilizer per 100 parts by weight of the thermoplastic resin composition.
<14> The thermoplastic resin composition of <13>, wherein the organic or/and inorganic heat stabilizer is substantially free from copper element.
<15> The thermoplastic resin composition of any one of <1> to <14>, further comprising 0.01 to 5 parts by weight of an organic or/and inorganic light stabilizer per 100 parts by weight of the thermoplastic resin composition.
<16> The thermoplastic resin composition of any one of <1> to <15>,
wherein the (A) crystalline thermoplastic resin is a polyamide resin which contains in the molecule thereof an aromatic ring, with a ratio of carbon atoms composing the aromatic ring relative to the polyamide resin molecule of 30 mol % or more.
<17> A resin article obtained by molding the thermoplastic resin composition described in any one of <1> to <16>.
<18> The resin article of <17>, further comprising a plated layer formed on the surface of the resin article.
<19> The resin article of <17> or <18>, which is a part for a light emitting diode device.
<20> The resin article of <19>, wherein the part for a light emitting diode device functions as a reflective plate.
<21> The resin article of <18> or <19>,
wherein the plated layer performs as an electro-conductive circuit.
<22> A method of manufacturing a resin article with a plated layer, comprising irradiating the surface of the resin article, obtained by molding the thermoplastic resin composition described in anyone of <1> to <16>, with a laser, and then applying a metal to form the plated layer.
<23> The method of manufacturing a resin article with a plated layer of <22>, wherein the plated layer contains at least one kind selected from, copper, nickel, silver and gold.
<24> The method of manufacturing a resin article with a plated layer of <23>, wherein the plated layer is used in the form of multi-layered structure.
<25> A method of manufacturing a part for a light emitting diode device having an electro-conductive circuit, comprising the method of manufacturing a resin article with a plated layer described in any one of <22> to <24>.

Advantageous Effects of Invention

According to the present invention, it now became possible to provide a thermoplastic resin composition which is highly resistant to heat of solder, excellent in platability (appearance of plating), and keeps high reflectance even after being aged under heating.

BRIEF DESCRIPTION OF DRAWINGS

FIG. 1 is a schematic drawing illustrating a process of forming a plated layer on the surface of a resin article. In FIG. 1, reference numeral 1 stands for a resin article, 2 for a laser light, 3 for portions irradiated by the laser light, 4 for a plating solution, and 5 for a plated layer.

DESCRIPTION OF EMBODIMENTS

The present invention will be detailed below. Note in this specification that the wording "to" with preceding and succeeding numerals is used for indicating a numerical range with the lower and upper limits thereof respectively given by these numerals. The reflectance in this specification is reflectance measured at 450 nm, unless otherwise specifically noted.

The thermoplastic resin composition of the present invention characteristically contains, per 100 parts by weight of a crystalline thermoplastic resin having a melting point, measured by differential scanning calorimetry (DSC) at a heating rate of 10° C./min, of 250° C. or above; 10 to 80 parts by weight of a glass filler; 1 to 30 parts by weight of a laser direct structuring additive having a reflectance at 450 nm of 25% or above; and 20 to 150 parts by weight of titanium oxide.

The individual constituents of the present invention will be explained below.

<(A) Crystalline Thermoplastic Resin>

The thermoplastic resin composition of the present invention characteristically shows a melting point, measured by differential scanning calorimetry (DSC) at a heating rate of 10° C./min, of 250° C. or above, and preferably 255° C. or above. While the upper limit is not specifically limited, it is generally 350° C. or below. By using this sort of resin, dimension of product may effectively be maintained even in the process of reflow soldering.

The crystalline thermoplastic resin is defined as a thermoplastic resin which has a clear crystal structure or a crystallizable molecular structure, shows a non-glassy property, has a measurable heat of melting, and shows a clear melting point. The melting point and the heat of melting are measurable by using a differential scanning calorimeter, exemplified by DSC-II from PerkinElmer, Inc. More specifically, the crystalline thermoplastic resin is defined as the one which shows a heat of melting of 1 cal/g or more, when measured using this instrument. The melting point is measurable by heating a sample using the differential scanning calorimeter, at a heating rate of 10° C./min up to a temperature not lower than a predicted melting point, cooling the sample at a cooling rate of 10° C./min down to 20° C., allowing the sample to stand for approximately one minute, and again heating the sample at a heating rate of 10° C./min.

Specific examples of the crystalline thermoplastic resin include polyolefin resin, polyester resin, polyacetal resin, polyphenylene sulfide resin, polyamide resin and liquid crystal polymer, wherein polyamide resin is preferable. Only a single species of the crystalline thermoplastic resin may be used independently, or a mixture of two or more species may be used.

The polyester resin may be referred to, and selectable from, those described in paragraphs [0013] to [0016] of JP-A-2010-174223.

The polyacetal resin may be referred to, and selectable from, those described in paragraph [0011] of JP-A-2003-003041, and paragraphs [0018] to [0020] of JP-A-2003-220667.

The polyamide resin may be referred to, and selectable from, those described in paragraphs [0011] to [0013] of JP-A-2011-132550. The polyamide resin preferably contains a diamine structural unit (structural unit derived from diamine), 50 mol % or more of which being derived from xylylene diamine. This is a xylylene diamine-based polyamide resin, in which 50 mol % or more of diamine is derived from xylylene diamine, and is polycondensed with a dicarboxylic acid.

The xylylene diamine-based polyamide resin is such as having the diamine structural unit, preferably 70 mol % or more of which, and more preferably 80 mol % or more of which is derived from metaxylylene diamine and/or paraxylylene diamine, and having the dicarboxylic acid structural unit (structural unit derived from dicarboxylic acid), preferably 50 mol % or more of which, more preferably 70 mol % or more of which, and particularly 80 mol % or more of which is derived from $\alpha,\omega$-straight-chain aliphatic dicarboxylic acid preferably having 4 to 20 carbon atoms. As the $\alpha,\omega$-straight-chain aliphatic dibasic acid having 4 to 20 carbon atoms, preferably used are adipic acid, sebacic acid, suberic acid, dodecanedioic acid, eicosadienoic acid or the like.

In the present invention, a polyamide resin which contains in the molecule thereof an aromatic ring, with a ratio of carbon atoms composing the aromatic ring relative to the polyamide resin molecule of 30 mol % or more, is particularly preferable. By using this sort of resin, the resin composition may be reduced in water absorption, and effectively suppressed in dimensional change as a consequence.

Glass transition point of the crystalline thermoplastic resin used in the present invention is preferably 40 to 180° C., and more preferably 60 to 130° C.

Number average molecular weight of the crystalline thermoplastic resin used in the present invention is preferably 5,000 to 45,000, and more preferably 10,000 to 25,000.

Amount of addition of the crystalline thermoplastic resin in the thermoplastic resin composition of the present invention is preferably 50 to 100% by weight, and more preferably 70 to 100% by weight.

<(B) Glass Filler>

The thermoplastic resin composition of the present invention contains the glass filler. The glass filler is at least one material selected from chopped fiber, milled fiber, flake, bead and balloon, wherein chopped fiber, milled fiber and flake are preferable.

The chopped strand is a product obtained by cutting glass fiber uniformly into a length of 1 to 10 mm, and the milled fiber is a product obtained by crushing glass fiber into a length of 10 to 500 μm or around. The glass fiber is readily available as a commercial product from Nippon Electric Glass Co. Ltd.

The glass flake is a scaly product having a thickness of 1 to 20 μm and a length of one edge of 0.05 to 1.0 mm, wherein a commercial product of which is readily available, for example, under the trade name of "FLEKA" from Nippon Sheet Glass Co. Ltd.

The glass bead is a spherical product having an outer diameter of 10 to 100 μm, and is readily available, wherein a commercial product of which is readily available, for example, under the trade name of "EGB731" from Toshiba-Ballotini Co. Ltd.

The balloon is a hollow glass bead, wherein a commercial product of which is readily available under the trade name of "PZ6000" from Tokai Kogyo Co. Ltd.

The material glass preferably has an alkali-free composition, and is exemplified by E-glass, C-glass, S-glass and R-glass. In the present invention, E-glass is preferably used.

The glass filler is preferably surface-treated with a silane coupling agent such as γ-methacryloxypropyl trimethoxysilane, γ-glycidoxypropyl trimethoxysilane or γ-aminopropyl triethoxysilane, with an amount of adhesion thereof of 0.01 to 1% by weight of the weight of glass fiber, in general. Further depending on needs, also the glass fibers surface-treated with fatty acid amide compound, lubricant such as silicone oil, antistatic agent such as quaternary ammonium salt, resin with film forming ability such as epoxy resin, urethane resin or the like; and mixture of resin with film forming ability with heat stabilizer, flame retardant or the like, may be used.

The amount of mixing of the glass filler in the thermoplastic resin composition of the present invention is 10 to 80 parts by weight per 100 parts by weight of the crystalline thermoplastic resin, preferably 10 to 60 parts by weight, more preferably 15 to 50 parts by weight, and furthermore preferably 15 to 40 parts by weight.

In the thermoplastic resin composition of the present invention, the crystalline thermoplastic resin and the glass filler jointly account for 50% by weight or more of the whole components in general.

<(C) Laser Direct Structuring Additive>

The LDS additive contained in the thermoplastic resin composition of the present invention characteristically has a reflectance at 450 nm of 25% or above, preferably 50 to 100%, and more preferably 60 to 100%. Only one species of the LDS additive may be used, or two or more species thereof may be used in combination.

The LDS additive in the present invention means a compound which enables formation of a metal plated layer on the laser-irradiated surface of PAMP6 from Mitsubishi Gas Chemical Corporation, Inc. (PAMP6 synthesized in Example described later), when 100 parts by weight of the resin is added with 4 parts by weight of an additive which is assumed to be the LDS additive, irradiated by a 1064 nm YAG laser light at an output power of 10 W, at a frequency of 80 kHz and at a speed of 3 m/s, and then subjected to electroless plating in M-Copper 85 plating bath from MacDermid, Inc. For an exemplary case where the resin added with the additive shows only a poor absorbance of YAG laser, and cannot therefore be exposed uniformly, it is permissible to add 10 to 40 parts by weight of titanium oxide for effective exposure by the laser.

The LDS additive used in the present invention may be a synthetic product or may be a commercially available product. The commercially available product may be those marketed as the LDS additive, or may be those marketed for any other purposes, so long as the requirements of the present invention may be satisfied. While many of publicly known LDS additives have appeared black, the present invention allows use of LDS additives which appear non-black, so that the resin article may now be colored.

The LDS additive used in the present invention preferably contains at least one element selected from copper, tin and antimony, more preferably contains antimony and tin with a content of tin larger than that of antimony, and particularly contains antimony and tin oxide with a content of tin larger than that of antimony. In another preferable embodiment, the LDS additive contains antimony oxide and tin oxide, with a content of tin larger than that of antimony.

When both of antimony and tin are contained, the ratio of weight is preferably 3.5:96.5 to 25:75, and more preferably 7.5:92.5 to 20:80.

In addition, the LDS additive used in the present invention preferably has a core composed of a composition having a reflectance at 450 nm of 50% or above, and has a coating composed of a composition containing at least one element selected from copper, tin and antimony, formed on a part of, or over the entire surface of the core. More preferably, the LDS additive has a core composed of a composition having a reflectance of 50% or above, and has a coating composed of a composition containing at least one element selected from copper, tin and antimony, formed over 60% or more of the surface area of the core. In this configuration, the composition containing at least one element selected from copper, tin and antimony becomes more likely to expose on the surface, so that even a small amount of composition containing at least one element selected from copper, tin and antimony will exhibit a large LDS effect. By using the composition having a reflectance of 50% or above as the composition for composing the core, the thermoplastic resin composition of the present invention will have a high reflectance.

The reflectance of the composition composing the core is more preferably 80% or above.

The composition for composing the core, having a reflectance of 50% or above, preferably contains a metal oxide, more preferably contains at least one species selected from silicon dioxide, mica and titanium oxide, and furthermore preferably contains titanium dioxide. One embodiment of the present invention exemplified herein is such that the composition for composing the core, having a reflectance of 50% or above contains 20% by weight or more of a metal oxide (preferably, substantially only the metal oxide). The metal oxide is preferably titanium oxide.

The composition to be coated, containing at least one element selected from copper, tin and antimony, preferably contains antimony and tin, more preferably contains antimony and tin with a content of tin larger than that of antimony, and furthermore preferably contains antimony and tin oxide with a content of tin larger than that of antimony. Another preferable example relates to a composition containing antimony oxide and tin oxide, with a content of tin larger than that of antimony.

Antimony and tin are preferably used at a weight ratio of 3.5:96.5 to 25:75, and more preferably 7.5:92.5 to 20:80.

When the LDS additive has the core, composed of a composition having a reflectance of 50% or above, and has the coating composed of a composition containing at least one element selected from copper, tin and antimony, formed on a part of, or over the entire surface of the core, the weight ratio of the composition composing the core and the composition composing the coating is preferably (40 to 90):(60 to 10), and more preferably (70 to 90):(30 to 10).

Examples of the LDS additive preferably used in the present invention includes tin doped with antimony, tin oxide doped with antimony, tin oxide doped with antimony oxide, and, a product having a core composed of a composition having a reflectance of 50% or above, and having a coating composed of any one of these materials.

Average grain size of the LDS additive is preferably 0.01 to 50 μm, and more preferably 0.05 to 30 μm. By adopting the configuration, uniformity of the plated surface when plating was applied will tend to be improved.

Amount of addition of the LDS additive in the thermoplastic resin composition of the present invention, per 100 parts by weight of the crystalline thermoplastic resin, is 1 to 30 parts by weight, preferably 3 to 25 parts by weight, more preferably 5 to 22 parts by weight, and furthermore preferably 8 to 20 parts by weight.

<(D) Titanium Oxide>

The thermoplastic resin composition of the present invention contains at least one species of the (D) titanium oxide.

The total amount of addition of the (D) titanium oxide(s) in the thermoplastic resin composition of the present invention, per 100 parts by weight of the (A) crystalline thermoplastic resin, is 20 to 150 parts by weight, preferably 30 to 120 parts by weight, more preferably 50 to 100 parts by weight, and particularly 50 to 80 parts by weight. If the amount of addition of the titanium oxide is less than 20 parts by weight, the reflectance will degrade after annealing.

Among commercially available titanium oxides, those containing 80% by weight or more of titanium oxide are preferably used from the viewpoint of whiteness and consealability.

The titanium oxide is exemplified by titanium monoxide (TiO), dititanium trioxide ($Ti_2O_3$) and titanium dioxide ($TiO_2$). While any of them is usable, titanium dioxide is preferable. Those having the rutile structure is preferably used.

The titanium oxide preferably has an average primary grain size of 1 μm or smaller, more preferably in the range from 0.001 to 0.5 μm, and furthermore preferably in the range from 0.002 to 0.1 μm. By adjusting the average grain size of the titanium oxide in the above described ranges, and by adjusting the amount of mixing in the above described ranges, the resultant thermoplastic resin composition will be able to give the article with an excellent whiteness and high reflectance of the surface.

The titanium oxide usable herein may be treated on the surface thereof. Agent for the surface treatment may be inorganic material and/or organic material. Specific examples include silica, metal oxides such as alumina and zinc oxide; and organic materials such as silane coupling agent, titanate coupling agent, organic acid, polyol and silicone.

The titanium oxide usable herein is any of those commercially available. Also usable is those obtained by appropriately crushing bulk or large grain-sized product, and then classifying through a mesh to adjust the grain size to the average value described above.

The thermoplastic resin composition of the present invention may further contain a variety of additives, without reducing the effects of the present invention. The additives are exemplified by talc, heat stabilizer, light stabilizer, alkali, mold releasing agent, antioxidant, UV absorber, flame retardant, dye/pigment, fluorescent brightener, anti-dripping agent, antistatic agent, anti-clouding agent, lubricant, anti-blocking agent, flow improver, plasticizer, dispersant, and antibacterial agent.

Only a single species of these components may be used, or two or more species thereof may be used in combination.

<Talc>

The thermoplastic resin composition of the present invention may contain talc. In the present invention, by mixing talc, portions irradiated by laser light will tend to be improved in platability.

Amount of mixing of talc in the thermoplastic resin composition of the present invention, per 100 parts by weight of the thermoplastic resin composition, is preferably 1 to 20 parts by weight, more preferably 1.5 to 20 parts by weight, furthermore preferably 2 to 15 parts by weight, and particularly 2 to 10 parts by weight.

<Heat Stabilizer>

The thermoplastic resin composition of the present invention may further contain an organic and/or inorganic heat stabilizer, and more preferably contains an organic heat stabilizer.

The heat stabilizer used in the present invention preferably is substantially free from copper. "Substantially" means that the content is below the limit of detection. By reducing the amount of mixing of copper to this level, change of color will now be suppressed.

The organic heat stabilizer is preferably at least one compound selected from the group consisting of phenol-based compound, phosphite-based compound, hindered amine-based compound, triazine-based compound and sulfur-containing compound.

Only one species of heat stabilizer may be used, or two or more species thereof may be used in combination.

The phenol-based compound is exemplified by, but not specifically limited to, hindered phenol-based compound.

The hindered phenol-based compound is exemplified by N,N'-hexane-1,6-diyl-bis[3-(3,5-di-t-butyl-4-hydroxyphenylpropionamide), pentaerythrityl-tetrakis[3-(3,5-di-t-butyl-4-hydroxyphenyl)propionate], N,N'-hexamethylenebis(3,5-di-t-butyl-4-hydroxy-hydrocinnamide), triethylene glycol-bis[3-(3-t-butyl-5-methyl-4-hydroxyphenyl) propionate], 3,9-bis{2-[3-(3-t-butyl-4-hydroxy-5-methylphenyl)propynyloxy]-1,1-dimethylethyl}-2,4,8,10-tetraoxaspiro[5.5]undecane, 3,5-di-t-butyl-4-hydroxybenzylphosphonate-diethyl ester, 1,3,5-trimethyl-2,4,6-tris(3,5-di-t-butyl-4-hydroxybenz yl)benzene, and 1,3,5-tris(4-t-butyl-3-hydroxy-2,6-dimethylbenzyl)isocyanuric acid.

The phosphite-based compound is exemplified by, but not limited to, trioctyl phosphite, trilauryl phosphite, tridecyl phosphite, octyl diphenyl phosphite, trisisodecylphosphite, phenyl diisodecyl phosphite, phenyl di(tridecyl)phosphite, diphenyl isooctyl phosphite, diphenyl isodecylphosphite, diphenyl(tridecyl)phosphite, triphenyl phosphite, tris(nonyl phenyl)phosphite, tris(2,4-di-t-butylphenyl)phosphite, tris(2,4-di-t-butyl-5-methylphenyl)phosphite, tris(butoxyethyl) phosphite, 4,4'-butylidene-bis(3-methyl-6-t-butylphenyl-tetramidecyl)diphosphite, tetra ($C_{12-15}$ mixed alkyl)-4,4'-isopropylidenediphenyl diphosphite, 4,4'-isopropylidene-bis (2-t-butylphenyl)di(nonylphenyl) phosphite, tris(biphenyl) phosphite, tetra(tridecyl)-1,1,3-tris(2-methyl-5-t-butyl-4-hydroxy phenyl)butane diphosphite, tetra(tridecyl)-4,4'-butylidene-bis(3-methyl-6-t-butylphenyl)diphosphite, tetra ($C_{1-15}$ mixed alkyl)-4,4'-isopropilidene diphenyl diphosphite, tris(mono- and di-mixed nonylphenyl)phosphite, 4,4'-isopropylidene-bis(2-t-butylphenyl)di(nonylphenyl) phosphite, 9,10-dihydro-9-oxa-9-oxa-10-phosphaphenanthrene-10-oxide, tris(3,5-di-t-butyl-4-hydroxyphenyl)phosphite, hydrogenated 4,4'-isopropylidene phenylpoly phosphite, bis (octylphenyl) bis(4,4'-butylidene-bis(3-methyl-6-t-butylphenyl)) 1,6-hexanol diphosphite, hexatridecyl-1,1,3-tris (2-methyl-4-hydroxy-5-t-butylphenyl)diphosphite, tris(4,4'-isopropylidene bis(2-t-butylphenyl))phosphite, tris(1,3-stearoyloxyisopropyl)phosphite, 2,2-methylenebis(4,6-di-t-butylphenyl)octyl phosphite, 2,2-methylene-bis(3-methyl-4,6-di-t-butylphenyl)-2-ethylhexyl phosphite, tetrakis(2,4-di-t-butyl-5-methylphenyl)-4,4'-biphenylene diphosphite, and tetrakis(2,4-di-t-butylphenyl)-4,4'-biphenylene diphosphite.

The phosphite-based compound is exemplified by, but not specifically limited to, pentaerythritol-type phosphite compound. The pentaerythritol-type phosphite compound is exemplified by 2,6-di-t-butyl-4-methylphenyl phenyl pentaerythritol diphosphite, 2,6-di-t-butyl-4-methylphenyl methyl pentaerythritol diphosphite, 2,6-di-t-butyl-4-methylphenyl 2-ethylhexyl-pentaerythritol diphosphite, 2,6-di-t-butyl-4-methylphenyl isodecyl pentaerythritol diphosphite, 2,6-di-t-butyl-4-methylphenyl lauryl pentaerythritol diphosphite, 2,6-di-t-butyl-4-methylphenyl isotridecyl pentaerythritol diphosphite, 2,6-di-t-butyl-4-methylphenyl stearyl pentaerythritol diphosphite, 2,6-di-t-butyl-4-methylphenyl cyclohexyl pentaerythritol diphosphite, 2,6-di-t-butyl-4-methylphenyl benzyl pentaerythritol diphosphite, 2,6-di-t-butyl-4-methylphenyl ethylcellosolve pentaerythritol diphosphite, 2,6-di-t-butyl-4-methylphenyl butylcarbitol pentaerythritol diphosphite, 2,6-di-t-butyl-4-methylphenyl octylphenyl pentaerythritol diphosphite, 2,6-di-t-butyl-4-methylphenyl nonylphenyl pentaerythritol diphosphite, bis(2,6-di-t-butyl-4-methylphenyl)pentaerythritol diphosphite, bis(2,6-di-t-butyl-4-ethylphenyl)pentaerythritol diphosphite, 2,6-di-t-butyl-4-methylphenyl 2,6-di-t-butylphenyl pentaerythritol diphosphite, 2,6-di-t-butyl-4-methylphenyl 2,4-di-t-butylphenyl pentaerythritol diphosphite, 2,6-di-t-butyl-4-methylphenyl 2,4-di-t-octylphenyl pentaerythritol diphosphite, 2,6-di-t-butyl-4-methylphenyl 2-cyclohexylphenyl pentaerythritol diphosphite, 2,6-di-t-amyl-4-methylphenyl phenyl pentaerythritol diphosphite, bis(2,6-di-t-amyl-4-methylphenyl)pentaerythritol diphosphite, and bis(2,6-di-t-octyl-4-methylphenyl)pentaerythritol diphosphite.

The pentaerythritol-type phosphite compound is preferably bis(2,6-di-t-butyl-4-methylphenyl)pentaerythritol diphosphite, bis(2,6-di-t-butyl-4-ethylphenyl)pentaerythritol diphosphite, bis(2,6-di-t-amyl-4-methylphenyl)pentaerythritol diphosphite, and bis(2,6-di-t-octyl-4-methylphenyl) pentaerythritol diphosphite, wherein bis(2,6-di-t-butyl-4-methylphenyl)pentaerythritol diphosphite is more preferable.

The hindered amine-based compound is exemplified by, but not specifically limited to, 4-acetoxy-2,2,6,6-tetramethylpiperidine, 4-stearoyloxy-2,2,6,6-tetramethylpiperidine, 4-acryloyloxy-2,2,6,6-tetramethylpiperidine, 4-(phenylacetoxy)-2,2,6,6-tetramethylpiperidine, 4-benzoyloxy-2,2,6,6-tetramethylpiperidine, 4-methoxy-2,2,6,6-tetramethylpiperidine, 4-stearyloxy-2,2,6,6-tetramethylpiperidine, 4-cyclohexyloxy-2,2,6,6-tetramethylpiperidine, 4-benzyloxy-2,2,6,6-tetramethylpiperidine, 4-phenoxy-2,2,6,6-tetramethylpiperidine, 4-(ethylcarbamoyloxy)-2,2,6,6-tetramethylpiperidine, 4-(cyclohexylcarbamoyloxy)-2,2,6,6-tetramethylpiperidin e, 4-(phenylcarbamoyloxy)-2,2,6,6-tetramethylpiperidine, bis(2,2,6,6-tetramethyl-4-piperidyl) carbonate, bis(2,2,6,6-tetramethyl-4-piperidyl)oxalate, bis (2,2,6,6-tetramethyl-4-piperidyl)malonate, bis(2,2,6,6-tetramethyl-4-piperidyl)sebacate, bis(2,2,6,6-tetramethyl-4-piperidyl)adipate, bis(2,2,6,6-tetramethyl-4-piperidyl) terephthalate, 1,2-bis(2,2,6,6-tetramethyl-4-piperidyloxy)-ethane, α,α'-bis(2,2,6,6-tetramethyl-4-piperidyloxy)-p-xylene, bis(2,2,6,6-tetramethyl-4-piperidyltrilene-2,4-dicarbamate, bis(2,2,6,6-tetramethyl-4-piperidyl)-hexamethylene-1,6-dicarbamate, tris(2,2,6,6-tetramethyl-4-piperidyl)-benzene-1,3,5-tri carboxylate, tris(2,2,6,6-tetramethyl-4-piperidyl)-benzene-1,3,4-tri carboxylate, 1-[2-{3-(3,5-di-t-butyl-4-hydroxyphenyl) propionyloxy}butyl]-4-[3-(3,5-di-t-butyl-4-hydroxyphenyl) propionyloxy]2,2,6,6-tetramethylpiperidine, and condensate of 1,2,3,4-butanetetracarboxylic acid and 1,2,2,6,6-pentamethyl-4-piperidinol and β,β,β',β'-tetramethyl-3,9-[2,4,8,10-tetraoxaspiro(5.5)undecane]diethanol.

The triazine-based compound is exemplified by, but not specifically limited to, hydroxyphenyltriazines.

The hydroxyphenyltriazines are exemplified by 2,4,6-tris(2'-hydroxy-4'-octyloxyphenyl)-1,3,5-triazine, 2-(2'-hydroxy-4'-hexyloxyphenyl)-4,6-diphenyl-1,3,5-tri azine, 2-(2'-hydroxy-4'-octyloxyphenyl)-4,6-bis(2',4'-dimethylphenyl)-1,3,5-triazine, 2-(2',4'-dihydroxyphenyl)-4,6-bis(2',4'-dimethylphenyl)-1,3,5-triazine, 2,4-bis(2'-hydroxy-4'-propyloxyphenyl)-6-(2',4'-dimethylphenyl)-1,3,5-triazine, 2-(2-hydroxy-4-octyloxyphenyl)-4,6-bis(4'-methylphenyl)-1,3,5-triazine, 2-(2'-hydroxy-4'-dodecyloxyphenyl)-4,6-bis(2',4'-dimeth ylphenyl)-1,3,5-triazine, 2,4,6-tris(2'-hydroxy-4'-isopropyloxyphenyl)-1,3,5-triazine, 2,4,6-tris(2'-hydroxy-4'-n-hexyloxyphenyl)-1,3,5-triazine, and 2,4,6-tris(2'-hydroxy-4'-ethoxycarbonylmethoxyphenyl)-1,3,5-triazine.

The sulfur-containing compound is exemplified by, but not specifically limited to, pentaerythrityl tetrakis(3-laurylthiopropionate), dilauryl-3,3'-thiodipropionate, dimyristyl-3,3'-thiodipropionate, and distearyl-3,3'-thiodipropionate.

Preferable examples of the inorganic heat stabilizer include metal hydroxides which are exemplified by magnesium hydroxide, calcium hydroxide and antimony trioxide. In particular, an alkali added as the inorganic heat stabilizer, when the LDS additive is an acidic substance, will also act as an alkali component for making hue of the LDS additives, described later, uniform. This sort of alkali may also acts as the heat stabilizer in some cases.

Content of the heat stabilizer per 100 parts by weight of the thermoplastic resin composition of the present invention, is preferably 0.01 parts by weight to 5 parts by weight, more preferably 0.01 to 3 parts by weight, furthermore preferably 0.01 to 2.5 parts by weight, and particularly 0.03 to 2 parts by weight. Heat stabilizing effect may be insufficient if the heat stabilizer is too short, whereas the effect may saturate to thereby degrade the economy if the heat stabilizer is too much.

<Light Stabilizer>

The thermoplastic resin composition of the present invention preferably contains an organic and/or inorganic light stabilizer, and more preferably contains an organic light stabilizer.

The organic light stabilizer is exemplified by UV-absorbing compounds such as benzophenone-based compound, salicylate-based compound, benzotriazole-based compound, and cyano acrylate-based compound; and radical-scavenging compounds such as hindered amine-based compound and hindered phenol-based compound.

By combining the UV-absorbing compound and the radical-scavenging compound for use as the light stabilizer, a higher degree of stabilizing effect may be exhibited.

Only a single species of the light stabilizer may be used, or two or more species thereof may be used in combination.

The benzophenone-based compound is exemplified by, but not specifically limited to, 2-hydroxy-4-n-octoxybenzophenone, 2,2'-dihydroxy-4-methoxybenzophenone, 2,2'-dihydroxy-4,4'-dimethoxybenzophenone, 2,2'4,4'-tetrahydroxybenzophenone, 2-hydroxy-4-methoxybenzophenone, 2,4-dihydroxybenzophenone, and 2-hydroxy-4-octyloxybenzophenone.

The salicylate-based compound is exemplified by, but not specifically limited to, phenyl salicylate, p-t-butylphenyl salicylate, and p-octylphenyl salicylate.

The benzotriazole-based compound is exemplified by, but not specifically limited to, 2-(2'-hydroxy-5'-methylphenyl)benzotriazole, 2-(3-t-butyl-5-methyl-2-hydroxyphenyl)-5-chlorobenzotriazole, 2-(2'-hydroxy-3',5'-di-t-butylphenyl)benzotriazole, 2-(2'-hydroxy-5'-t-octylphenyl)benzotriazole, 2-(2'-hydroxy-3'-t-butyl-5'-methylphenyl)-5-chlorobenzotriazole, 2-(2'-hydroxy-3',5'-di-t-butylphenyl)-5-chlorobenzotriazole, 2-(2'-hydroxy-3',5'-di-t-aminophenyl)benzotriazole, 2-{2'-hydroxy-3'-(3",4",5",6"-tetrahydrophthalimidemethyl)-5'-methylphenyl}benzotriazole, 2,2-methylenebis{4-(1,1,3,3-tetramethylbutyl)-6-(2H-benzotriazole-2-yl)phenol}, and 6-(2-benzotriazolyl)-4-t-octyl-6'-t-butyl-4'-methyl-2,2'-methylenebisphenol.

The cyano acrylate-based compound is exemplified by, but not specifically limited to, 2-ethylhexyl-2-cyano-3,3'-diphenyl acrylate, and ethyl-2-cyano-3,3'-diphenyl acrylate.

The hindered amine-based compound is exemplified by, but not specifically limited to, bis(2,2,6,6-tetramethyl-4-piperidyl)sebacate, bis(2,2,6,6-tetramethyl-4-piperidyl)succinate, bis(1,2,2,6,6-pentamethyl-4-piperidyl)sebacate, bis(1-octyloxy-2,2,6,6-tetramethyl-4-piperidyl)sebacate, bis(1,2,2,6,6-pentamethyl-4-piperidyl)-n-butyl-3,5-di-t-butyl-4-hydroxybenzyl malonate, condensate of 1-(2-hydroxyethyl)-2,2,6,6-tetramethyl-4-hydroxypiperidine and succinic acid, straight chain-like or cyclic condensate of N,N'-bis(2,2,6,6-tetramethyl-4-piperidyl)hexamethylenediamine and 4-tert-octylamino-2,6-dichloro-1,3,5-triazine, tris(2,2,6,6-tetramethyl-4-piperidyl)nitrilotriacetate, tetrakis(2,2,6,6-tetramethyl-4-piperidyl)-1,2,3,4-butanetetracarboxylate, 1,1'-(1,2-ethanediyl)-bis(3,3,5,5-tetramethylpiperazinone), 4-benzoyl-2,2,6,6-tetramethylpiperidine, 4-stearyloxy-2,2,6,6-tetramethylpiperidine, bis(1,2,2,6,6-pentamethylpiperidyl)-2-n-butyl-2-(2-hydr oxy-3,5-di-t-butylbenzyl)malonate, 3-n-octyl-7,7,9,9-tetramethyl-1,3,8-triazaspiro[4.5]decane-2,4-dione, bis(1-octyloxy-2,2,6,6-tetramethylpiperidyl)sebacate, bis(1-octyloxy-2,2,6,6-tetramethylpiperidyl)succinate, N,N'-bis(2,2,6,6-tetramethyl-4-piperidinyl)-1,3-benzene dicarboxamide, straight chain-like or cyclic condensate of N,N'-bis(2,2,6,6-tetramethyl-4-piperidyl)-hexamethylene diamine and 4-morpholino-2,6-dichloro-1,3,5-triazine, condensate of 2-chloro-4,6-bis(4-n-butylamino-2,2,6,6-tetramethylpiperidyl)-1,3,5-triazine and 1,2-bis(3-aminopropylamino)ethane, condensate of 2-chloro-4,6-di-(4-n-butylamino-1,2,2,6,6-pentamethylpiperidyl)-1,3,5-triazine with 1,2-bis-(3-aminopropylamino)ethane, 8-acetyl-3-dodecyl-7,7,9,9-tetramethyl-1,3,8-triazaspiro[4.5]decane-2,4-dione, 3-dodecyl-1-(2,2,6,6-tetramethyl-4-piperidyl)pyrrolidine-2,5-dione, 3-dodecyl-1-(1,2,2,6,6-pentamethyl-4-piperidyl)pyrrolidine-2,5-dione, mixture of 4-hexadecyloxy- and 4-stearyloxy-2,2,6,6-tetramethylpiperidine, condensate of N,N'-bis(2,2,6,6-tetramethyl-4-piperidyl)hexamethylenediamine and 4-cyclohexylamino-2,6-dichloro-1,3,5-triazine, condensate of 1,2-bis(3-aminopropylamino)ethane with 2,4,6-trichloro-1,3,5-triazine and with 4-butylamino-2,2,6,6-tetramethylpiperidine (CAS No. [136504-96-6]); condensate of 1,6-hexanediamine with 2,4,6-trichloro-1,3,5-triazine and with N,N-dibutylamine and with 4-butylamino-2,2,6,6-tetramethylpiperidine (CAS No. [192268-64-7]); N-(2,2,6,6-tetramethyl-4-piperidyl)-n-dodecylsuccinimide, N-(1,2,2,6,6-pentamethyl-4-piperidyl)-n-dodecylsuccinimide, 2-undecyl-7,7,9,9-tetramethyl-1-oxa-3,8-diaza-4-oxo-spiro[4.5]decane, reaction product formed between 7,7,9,9-tetramethyl-2-cycloundecyl-1-oxa-3,8-diaza-4-oxo-spiro[4.5]decane and epichlorohydrin, 1,1-bis(1,2,2,6,6-pentamethyl-4-piperidyloxycarbonyl)-2-(4-methoxyphenyl)ethene, N,N'-bis-formyl-N,N'-bis(2,2,6,6-tetramethyl-4-piperidyl) hexamethylenediamine, diester formed between 4-methoxymethylenemalonic acid and 1,2,2,6,6-pentamethyl-4-hydroxypiperidine, poly[methylpropyl-3-oxy-4-(2,2,6,6-tetramethyl-4-piperidyl)]siloxane, reaction product formed between maleic anhydride-α-olefin copolymer and 2,2,6,6-tetramethyl-4-aminopiperidine or 1,2,2,6,6-pentamethyl-4-aminopiperidine, 2,4-bis[N-(1-cyclohexyloxy-2,2,6,6-tetramethylpiperidine-4-yl)-N-butylamino]-6-(2-hydroxyethyl)amino-1,3,5-triazine, 1-(2-hydroxy-2-methylpropoxy)-4-octadecanoyloxy-2,2,6,6-tetramethylpiperidine, 5-(2-ethylhexanoyl)oxymethyl-3,3,5-trimethyl-2-morpholinone, Sanduvor (from Clariant; CAS No. [106917-31-1]), 5-(2-ethylhexanoyl)oxymethyl-3,3,5-trimethyl-2-morpholinone, reaction product formed between 2,4-bis[(1-cyclohexyloxy-2,2,6,6-piperidine-4-yl)butylamino]-6-chloro-s-triazine and N,N'-bis(3-aminopropyl)ethylenediamine, 1,3,5-tris(N-cyclohexyl-N-(2,2,6,6-tetramethylpiperidine-3-one-4-yl)amino)-s-triazine, 1,3,5-tris(N-cyclohexyl-N-(1,2,2,6,6-pentamethylpiperazine-3-one-4-yl)amino)-s-triazine, N,N',N'',N'''-tetrakis(4,6-bis(butyl-(N-methyl-2,2,6,6-tetramethylpiperidine-4-yl)amino)-triazine-2-yl)-4,7-diazadecane-1,10-diamine, and poly[[6-(1,1,3,3-tetramethylbutyl)amino-1,3,5-triazine-2,4-diyl][(2,2,6,6-tetramethyl-4-piperidyl)imino]hexamethylene{(2,2,6,6-tetramethyl-4-piperidyl)imino}]. Among them, bis(2,2,6,6-tetramethyl-4-piperidyl)sebacate, bis(2,2,6,6-tetramethyl-4-piperidyl)succinate, bis(1,2,2,6,6-pentamethyl-4-piperidyl)sebacate, N,N'-bis(2,2,6,6-tetramethyl-4-piperidinyl)-1,3-benzene dicarboxamide, and N,N',N'',N'''-tetrakis-(4,6-bis-(butyl-(N-methyl-2,2,6,6-tetramethylpiperidine-4-yl)amino)-triazine-2-yl)-4,7-diazadecane-1,10-diamine are preferable.

The hindered phenol-based compound is exemplified by, but not specifically limited to, pentaerythrityl-tetrakis{3-(3,5-di-t-butyl-4-hydroxyphenyl)propionate}, N,N-hexamethylenebis(3,5-di-t-butyl-4-hydroxy-hydrocinnamide, triethylene glycol-bis{3-(3-t-butyl-5-methyl-4-hydroxyphenyl)propionate}, 3,9-bis{2-[3-(3-t-butyl-4-hydroxy-5-methylphenyl)propynyloxy]-1,1-dimethylethyl}-2,4,8,10-tetraoxaspiro[5.5]undecane, 3,5-di-t-butyl-4-hydroxybenzylphosphonate-diethyl ester, 1,3,5-trimethyl-2,4,6-tris(3,5-di-t-butyl-4-hydroxybenzyl)benzene, and 1,3,5-tris(4-t-butyl-3-hydroxy-2,6-dimethylbenzyl)isocyanate.

Content of the light stabilizer, per 100 parts by weight of the thermoplastic resin composition of the present invention, is preferably 0.01 parts by weight to 5 parts by weight, more preferably 0.01 to 3 parts by weight, and furthermore preferably 0.03 to 2 parts by weight.

<Alkali>

The thermoplastic resin composition of the present invention may contain an alkali. When the LDS additive used in the present invention is an acidic substance (with an acidity of pH6 or below, for example), the resin article may sometimes be mottled in color since the LDS additive per se may be reduced due to combination with the resin. By adding the alkali, it is now possible to make the color of the resultant resin article more uniform. Alkali is selectable from calcium hydroxide, magnesium hydroxide and so forth, without special limitation. Only one species of alkali may be used, or two or more species thereof may be used in combination.

Although depending on species of the LDS additive and species of the alkali, amount of addition of the alkali in the thermoplastic resin composition of the present invention is preferably 0.01 to 10% by weight relative to the amount of addition of the LDS additive, and more preferably 0.05 to 5% by weight.

<Mold Releasing Agent>

The thermoplastic resin composition of the present invention may also contain a mold releasing agent. The mold releasing agent is exemplified by aliphatic carboxylic acid, ester formed between aliphatic carboxylic acid and alcohol, aliphatic hydrocarbon compound with a number average molecular weight of 200 to 15,000, and polysiloxane-based silicone oil.

The aliphatic carboxylic acid is exemplified by saturated or unsaturated, aliphatic monovalent, divalent and trivalent carboxylic acids. The aliphatic carboxylic acid herein also includes alicyclic carboxylic acid. Among them, preferable examples of the aliphatic carboxylic acid include $C_{6-36}$ monovalent and divalent carboxylic acids, wherein $C_{6-36}$ aliphatic saturated monovalent carboxylic acid is more preferable. Specific examples of the aliphatic carboxylic acid include palmitic acid, stearic acid, caproic acid, capric acid, lauric acid, arachic acid, behenic acid, lignoceric acid, cerotic acid, mellisic acid, tetratriacontanoic acid, montanic acid, adipic acid, and azelaic acid.

The aliphatic carboxylic acid composing the ester formed between the aliphatic carboxylic acid and alcohol may be those described above. On the other hand, the alcohol is exemplified by saturated or unsaturated, monohydric or polyhydric alcohol. These alcohols may have a substituent such as fluorine atom, aryl group or the like. Among them, $C_{30}$ or shorter monohydric or polyhydric, saturated alcohol is preferable, and $C_{30}$ or shorter aliphatic or alicyclic saturated monohydric alcohol or aliphatic saturated polyhydric alcohol is more preferable.

Specific examples of these sorts of alcohol include octanol, decanol, dodecanol, stearyl alcohol, behenyl alcohol, ethylene glycol, diethylene glycol, glycerin, pentaerythritol, 2,2-dihydroxylperfluoropropanol, neopentylene glycol, ditrimethylolpropane, and dipentaerythritol.

Specific example of the ester formed between the aliphatic carboxylic acid and the alcohol include beeswax (mixture mainly composed of myricyl palmitate), stearyl stearate, behenyl behenate, stearyl behenate, glycerin monopalmitate, glycerin monostearate, glycerin distearate, glycerin tristearate, pentaerythritol monopalmitate, pentaerythritol monostearate, pentaerythritol distearate, pentaerythritol tristearate, and pentaerythritol tetrastearate.

The aliphatic hydrocarbon with a number average molecular weight of 200 to 15,000 is exemplified by liquid paraffin, paraffin wax, microwax, polyethylene wax, Fischer-Tropsch wax, and $CO_{3-12}$ α-olefin oligomer. The aliphatic hydrocarbon herein includes also alicyclic hydrocarbon. The number average molecular weight of the aliphatic hydrocarbon is preferably 5,000 or smaller.

Among them, paraffin wax, polyethylene wax and partially oxidized polyethylene wax are preferable, and paraffin wax and polyethylene wax are more preferable.

Content of the mold releasing agent, per 100 parts by weight in total of the thermoplastic resin and the glass filler, is generally 0.001 to 2 parts by weight, preferably 0.01 to 1 part by weight. If the content of the mold releasing agent is less than the lower limit value of the above described range, the mold releasing effect will not always fully be exhibited, whereas the content of the mold releasing agent exceeding the upper limit value of the above described range may result in degraded anti-hydrolytic performance and pollution of dies in injection molding.

<Method of Manufacturing Thermoplastic Resin Composition>

Methods of manufacturing the thermoplastic resin composition of the present invention are arbitrarily selectable.

An exemplary method is such as mixing the thermoplastic resin, the glass filler, the LDS additive and so forth using a mixing means such as a V-type blender to thereby prepare a bulk blend, and then melt-kneading the bulk blend in a vented extruder for pelletizing. Another exemplary method relates to a two-stage kneading process, according to which the components other than the glass filler are thoroughly mixed in advance, then melt-kneaded in a vented extruder to produce pellets, the thus-obtained pellets are mixed with the glass filler, and the mixture is again melt-kneaded in the vented extruder.

A still another exemplary method is such as preparing in advance a thorough mixture of the components other than the glass filler using a V-type blender or the like, feeding the thus-obtained mixture through a first chute of a vented twin screw extruder, feeding the glass filler through a second chute in midway of the extruder, followed by melt-kneading and pelletizing.

In a screw configuration of a kneading zone of the extruder, an element for enhancing kneading is preferably placed on the upstream side, and an element with a pressurizing function is preferably placed on the downstream side.

The element for enhancing kneading is exemplified by progressive kneading disc element, orthogonal kneading disc element, wide kneading disc element, and progressive mixing screw element.

Heating temperature in the melt-kneading is arbitrarily selectable, generally in the range from 180 to 360° C. If the temperature is too high, decomposition gas is more likely to generate, which is causative of clouding. The screw configuration is preferably selected in consideration of shear heating and so forth. From the viewpoint of suppressing decomposition during kneading and post-processes, an antioxidant or heat stabilizer is preferably used.

Methods of manufacturing the resin molded article are arbitrarily selectable from those generally employed for molded article of thermoplastic resin composition, without special limitation. Examples of the methods include hollow molding processes such as injection molding, ultra high-speed injection molding, injection compression molding, two color formation and gas-assisted molding; method of molding using heat insulating dies, method of molding using rapid heating dies, foam molding (including supercritical fluid), insert molding, IMC (in-mold coating), extrusion molding, sheet molding, thermoforming, rotational molding, laminate molding, press molding, and blow molding. Also a method of molding based on the hot-runner system may be used.

Next, a method of providing the plated layer on the surface of the resin article molded from the thermoplastic resin composition of the present invention will be explained referring to FIG. 1. FIG. 1 is a schematic drawing illustrating a process of forming the plated layer on the surface of a resin article, by the laser direct structuring technique. The resin article 1 illustrated in FIG. 1 as a flat substrate, is not always necessarily a flat substrate, and may instead be a partially or wholly curved resin article. The resin article include not only final products, but also various components.

Referring now back to FIG. 1, the resin molded article 1 is irradiated with the laser light 2. The laser light herein is arbitrarily selectable from those obtainable by publicly-known lasers including YAG laser, excimer laser and electromagnetic wave, without special limitation. YGA laser is preferable. Wavelength of the laser light is not specifically limited, preferably in the range from 200 nm to 1,200 nm, and particularly in the range from 800 to 1,200 nm.

Upon irradiation with the laser light, the resin molded article 1 is activated only in the portions thereof irradiated by the laser light. While being kept in the activated state, the resin molded article 1 is applied with the plating solution 4. The plating solution 4 is widely selectable from publicly-known ones without special limitation, preferably a plating solution containing at least one kind of copper, nickel, gold, silver and palladium as a metal component (particularly non-electrolytic plating solution), more preferably a plating solution containing at least one kind of copper, nickel, gold and silver (particularly non-electrolytic plating solution), further more preferably a plating solution copper (particularly non-electrolytic plating solution).

Methods of applying the plating solution 4 to the resin molded article 1 are not specifically limited, and are exemplified by a method of dipping the resin molded article into a bath containing the plating solution. The resin molded article after being applied with the plating solution has the plated layer 5 only in the portions thereof irradiated by the laser light.

According to the method of the present invention, a line pattern of 1 mm pitch or narrower, and even 150 µm or narrower may be formed (the lower limit value is typically 30 µm or larger, although not specifically determined). The line pattern may be used as an antenna on the part for portable electronic instrument. In other words, one preferable embodiment of the resin molded article of the present invention is exemplified by a part for portable electronic instrument, having on the surface thereof the plated layer which functions as an antenna.

The article obtainable from the thermoplastic resin composition of the present invention may be used for various applications which include electronic parts such as connector, switch, relay and electro-conductive circuit; reflective plates such as lamp reflector; sliding parts such as gear and cam; vehicle parts such as air intake manifold; units where water is used, such as sink; various decorative parts, and other various applications including film, sheet and fiber.

The thermoplastic resin composition of the present invention gives an article with high levels of whiteness and reflectance, depending on methods of molding. The whiteness (based on the Hunter's method) of the article obtained from the thermoplastic resin composition of the present invention is generally 92 or above, and preferably 94 or above. The article obtained from the thermoplastic resin composition of the present invention is excellent in heat resistance, and also in light stability in actual environments of use. The article obtained from the thermoplastic resin composition of the present invention, therefore, serves as light reflective parts, in particular as parts for LED devices, and preferably as a reflective plate or an electro-conductive circuit of LED. The plated layer may be a single layer, or may have a multi-layered structure.

For any other aspects, descriptions in JP-A-2011-219620, JP-A-2011-195820, JP-A-2011-178873, JP-A-2011-168705 and JP-A-2011-148267 are appropriately referred to.

EXAMPLES

The present invention will further be explained referring to Examples. All of the materials, amounts of use, ratios, details of processes and procedures of processes may appropriately be altered, without departing from the spirit of the present invention. Accordingly, the present invention is not understood to be limited by the specific examples below.

<Exemplary Manufacture 1>
(Synthesis of Polyamide(PAP10))

In a 50-liter reactor vessel equipped with a stirrer, a partial condenser, a cooler, a thermometer, a dropping device, a nitrogen gas introducing feeding pipe, and a strand die, 8950 g (44.25 mol) of sebacic acid (under the product name of "Sebacic Acid TA", from Itoh Oil Chemicals Co. Ltd.), 12.54 g (0.074 mol) of calcium hypophosphite, and 6.45 g (0.079 mol) of sodium acetate were precisely weighed and placed.

The inner space of the reactor vessel was thoroughly replaced with nitrogen gas, then pressurized with nitrogen gas up to 0.4 MPa, the content was heated from 20° C. up to 190° C. under stirring, and then kept for 55 minutes so as to uniformly melt sebacic acid. Next, 5960 g (43.76 mol) of paraxylylenediamine (from Mitsubishi Gas Chemical Company Inc.) was dropped under stirring over 110 minutes. In this duration, the in-vessel temperature was continuously elevated up to 293° C. In the process of dropping, the pressure was controlled to 0.42 MPa, and the produced water was removed from the reaction system through the partial condenser and the cooler to the external. Temperature of the partial condenser was controlled to 145 to 147° C. After completion of the dropping of paraxylylenediamine, the polycondensation reaction was allowed to continue at an in-vessel pressure of 0.42 MPa for 20 minutes. In this duration, the in-vessel temperature was elevated up to 296° C. The in-vessel pressure was then decreased from 0.42 MPa down to 0.12 MPa over 30 minutes. In this duration, the in-vessel temperature was elevated up to 298° C. The pressure was then decreased at a rate of 0.002 MPa/min down to 0.08 MPa over 20 minutes, to thereby control the content of fraction with a molecular weight of 1,000 or smaller. The in-vessel temperature at the completion of the pressure reduction was 301° C. The reaction system was then pressurized with nitrogen gas, the polymer was drawn out in the form of strand from the strand die at an in-vessel temperature of 301° C. and at a resin temperature of 301° C., cooled in cooling water at 20° C., and pelletized to thereby obtain approximately 13 kg of polyamide resin. Cooling time in the cooling water was 5 seconds, and take-up speed of strand was 100 m/min. The product will be referred to as "PAP10", hereinafter. The melting point was 290° C.

<Exemplary Manufacture 2>
(Synthesis of Polyamide (PAMP6))

Adipic acid was melted under heating in a reactor vessel under a nitrogen atmosphere, the content was kept under stirring, and a 3:7 mixed diamine, in molar ratio, of paraxylylenediamine (from Mitsubishi Gas Chemical Corporation, Inc.) and metaxylylenediamine (from Mitsubishi Gas Chemical Corporation, Inc.) was gradually dropped under pressure (0.35 Mpa) so as to adjust the molar ratio of diamine and adipic acid (from Rhodia) to approximately 1:1, during which temperature was elevated up to 270° C. After the dropping, the pressure was reduced down to 0.06 MPa, the reaction was allowed to proceed for 10 minutes, to thereby control the content of fraction with a molecular weight of 1,000 or smaller. Thereafter, the content was drawn out in the form of strand, and pelletized using a pelletizer. The product will be referred to as "PAMP6", hereinafter. The melting point was 257° C.

Polyamide resin, polymetaxylyleneadipamide: MX Nylon S6007, trade name, from Mitsubishi Gas Chemical Corporation Inc., melting point=240° C. The polyamide resin will be referred to as "PAMXD", hereinafter.

<Glass Fillers>
GF (fiber): 03T-296 GH, E-glass from Nippon Electric Glass Co. Ltd.
Glass flake: REG302, E-glass from Nippon Sheet Glass Co. Ltd.
Glass bead: EGB731A-PN, E-glass from Toshiba-Ballotini Co. Ltd.

<LSD Additives>
(1) Black 1G: $CuCr_2O_4$ (from Shepherd Color Company), reflectance=7.2%
(2) Lazerflair 8840: $Cu_3(PO_4)_2Cu(OH)_2$ (from MERCK), reflectance=69.4%
(3) Lazerflair 820: mixture of mica+$SiO_2$ (35 to 53% by weight in total) and $TiO_2$ (11 to 15% by weight), coated with a composition composed of (Sb/Sn)$O_2$ (36 to 50% by weight) (from MERCK), reflectance=56.9%
(4) W-1: $TiO_2$ (79% by weight) coated with a composition composed of $SnO_2$ (18% by weight) and $Sb_2O_5$ (3% by weight) (from Mitsubishi Materials Corporation), reflectance=83%
(5) Minatec 40CM: mica+$SiO_2$ (57% by weight in total) coated with a composition composed of (Sb/Sn)$O_2$ (43% by weight) (from MERCK), reflectance=51.1%
(6) STANOSTAT CP5C: STANOSTAT: composition composed of $SnO_2$ and $Sb_2O_5$ (from Keeling & Walker), reflectance=61.7%

The values of reflectance described above were measured by placing powder of each LDS additive into a polyethylene bag of approximately 100 μm thick, using a visible-UV spectrophotometer UV-3100PC from Shimadzu Corporation.

<Titanium Oxide>
Titanium dioxide: CR-63 (from Ishihara Sangyo Kaisha Ltd.), rutile form, average grain size=0.21 μm
<Talc>
Talc: Micron White 5000S, from Hayashi-Kasei Co. Ltd.
<Heat Stabilizer>
Irganox 1098: from BASF
<Light Stabilizer>
Nylostab S-EED, from Clariant Japan
<Alkalis>
$Ca(OH)_2$
$Mg(OH)_2$
<Mold Releasing Agent>
405 MP: polyethylene wax (from Mitsui Chemicals Inc.)
<Compound>

The individual components were respectively weighed according to the compositional ratios listed in Tables shown later, the components other than the glass filler were mixed in a tumbler, the mixture was loaded from the base end of a twin screw extruder (TEM26SS, from Toshiba Machine Co. Ltd.), melted, the glass filler was side-fed, to thereby manufacture resin pellets. Temperature of the extruder was equally set over the entire portion thereof, and was varied depending on species of the resin. The temperature was set to 280° C. for PAMP6 and PAMXD6, and 300° C. for PAP10.

<Appearance of Plating>
Into a cavity of a die, with a size of 60×60 mm and a thickness of 2 mm, the resin was filled through a fan gate with a side length of 60 mm and a thickness of 1.5 mm to produce an article. The gate portion was cut off to obtain a plate-type test piece.

A 10×10 mm area of the plate-like test piece obtained above was irradiated using a laser irradiation apparatus LP-Z SERIES from SUNX (1064 nm YAG laser, maximum output=13 W), at an output of 80%, a pulse period of 20 is (microseconds), and a speed of 4 m/s. The test piece was then subjected to electroless plating in MIDCopper100XB Strike plating bath from MacDermid, Inc. at 60° C. Platability was visually determined based on the thickness of copper layer plated over 20 minutes.

Evaluation criteria are as follow. Results are shown in Tables below.

⊚: Very good appearance (thick plated layer confirmed based on deep copper color)
○: Good appearance
Δ: Plating confirmed but slightly thin (acceptable for practical use)
x: No plating <Reflectance (450 nm)>

Each test piece with a size of 60 mm×60 mm×2 mm (thickness) was manufactured by injection molding. The reflectance at 450 nm was measured using an visible/UV spectrophotometer UV-3100PC from Shimadzu Corporation. A wavelength of 450 nm falls in the wavelength range of blue light emitting diode. Articles having an initial reflectance of 50% or above may be judged as good, and are therefore usable for applications where high reflectance is required.

<Reflectance after Thermal Aging>

Each test piece with a size of 60 mm×60 mm×2 mm (thickness) was manufactured by injection molding. The test piece was kept in an hot air oven at 170° C. for 100 hours for thermal aging test. After the test, the reflectance was measured similarly as described above. The samples with a reflectance of 30% or larger are expectable for long-term use.

<Solder Heat Resistance>

Each test strip of the plate test piece (0.8 mm thick) was manufactured, dipped in a plating bath at 240° C. for 1 minute. The degree of deformation was visually observed, and judged according to the criteria below:

○: no deformation observed even after 1-minute dipping, showing a good appearance;

Δ: slight deformation observed at the corners of the test piece within one minute; and x: the test piece clearly deformed within one minute.

TABLE 1

| | | | Example 1 | Example 2 | Example 3 | Example 4 | Example 5 | Example 6 | Example 7 | Example 8 | Example 9 | Example 10 | Example 11 | Example 12 |
|---|---|---|---|---|---|---|---|---|---|---|---|---|---|---|
| Thermoplastic resin | PAP10 | Parts by weight | 100 | 100 | 100 | 100 | 100 | 100 | 100 | 100 | 100 | 100 | 100 | 100 |
| | PAMP6 | Parts by weight | | | | | | | | | | | | |
| | PAMXD6 | Parts by weight | | | | | | | | | | | | |
| Glass filler | GF | Parts by weight | 23 | 24 | 25 | 16 | 17 | 19 | 17 | 15 | 18 | 16 | 19 | 24 |
| | Glass flake | Parts by weight | | | | | | | | | | | | |
| | Glass beads | Parts by weight | | | | | | | | | | | | |
| LDS additive | Black1G | Parts by weight | | | | | | | | | | | | |
| | LF8840 | Parts by weight | | | | | | | 14 | | | | | |
| | LF820 | Parts by weight | 7 | 11 | 17 | 11 | 12 | 13 | | | | | | |
| | W-1 | Parts by weight | | | | | | | | 6 | 7 | 12 | 15 | 19 |
| | Minatec 40CM | Parts by weight | | | | | | | | | | | | |
| Titanium Oxide | CR-63 | Parts by weight | 23 | 24 | 25 | 34 | 43 | 56 | 43 | 22 | 53 | 23 | 57 | 95 |
| | Talc | Parts by weight | | | | | | | | | | | | |
| Heat Stabilizer | | Parts by weight | 0.5 | 1 | 1 | 1 | 1 | 1 | 1 | 1 | 1 | 1 | 1 | 1 |
| Light Stabilizer | | Parts by weight | 0.5 | | | | | | | | | | | |
| Alkalis | Ca(OH)$_2$ | Parts by weight | | | | | | | | 0.3 | 0.3 | 0.3 | 0.3 | 0.3 |
| | Mg(OH)$_2$ | Parts by weight | | | | 0.5 | 0.5 | 0.5 | 0.5 | | | | | |
| Mold Releasing Agent | | Parts by weight | 0.3 | 0.3 | 0.3 | 0.3 | 0.3 | 0.3 | 0.3 | 0.3 | 0.3 | 0.3 | 0.3 | 0.3 |
| Evaluation | Appearance of Plating | | Δ | ○ | ○ | ○ | ○ | ○ | ○ | Δ | Δ | ○ | ○ | ○ |
| | Reflectance (450 nm) | | 75.0 | 71.6 | 72.0 | 74.4 | 76.6 | 77.9 | 62.9 | 80.5 | 85.1 | 75.6 | 79.1 | 80.0 |
| | Reflectance after Thermal Aging | | 49.8 | 55.3 | 54.2 | 52.7 | 57.9 | 60.4 | 30.2 | 45.9 | 56.7 | 49.6 | 56.6 | 57.9 |
| | Solder Heat Resistance | | ○ | ○ | ○ | ○ | ○ | ○ | ○ | ○ | ○ | ○ | ○ | ○ |

TABLE 2

| | | | Example 13 | Example 14 | Example 15 | Example 16 | Example 17 | Comparative Example 1 | Comparative Example 2 | Comparative Example 3 | Comparative Example 4 | Comparative Example 5 |
|---|---|---|---|---|---|---|---|---|---|---|---|---|
| Thermoplastic resin | PAP10 | Parts by weight | 100 | 100 | | 100 | 100 | | | 100 | 100 | 100 |
| | PAMP6 | Parts by weight | | | 100 | | | | 100 | | | |
| | PAMXD6 | Parts by weight | | | | | | 100 | | | | |
| Glass filler | GF | Parts by weight | 18 | 18 | 18 | | | 18 | 5 | 18 | 20 | 19 |
| | Glass flake | Parts by weight | | | | 18 | | | | | | |
| | Glass beads | Parts by weight | | | | | 18 | | | | | |
| LDS additive | Black1G | Parts by weight | | | | | | | | | | 11 |
| | LF8840 | Parts by weight | | | | | | | | | | |
| | LF820 | Parts by weight | | | | | | | | | 8 | |
| | W-1 | Parts by weight | 7 | | 7 | 12 | 12 | 7 | 7 | 0.5 | | |
| | Minatec 40CM | Parts by weight | | 7 | | | | | | | | |
| Titanium Oxide | CR-63 | Parts by weight | 53 | 53 | 53 | 23 | 23 | 53 | 53 | 53 | 0 | 55 |
| | Talc | Parts by weight | 4 | | | | | | | | | |
| Heat Stabilizer | | Parts by weight | 1 | 1 | 1 | 1 | 1 | 1 | 1 | 1 | 1 | 1 |
| Light Stabilizer | | Parts by weight | | | | | | | | | | |
| Alkalis | Ca(OH)$_2$ | Parts by weight | 0.3 | 0.3 | 0.3 | 0.3 | 0.3 | 0.3 | 0.3 | 0.3 | | |
| | Mg(OH)$_2$ | Parts by weight | | | | | | | | | | |
| Mold Releasing Agent | | Parts by weight | 0.3 | 0.3 | 0.3 | 0.3 | 0.3 | 0.3 | 0.3 | 0.3 | 0.3 | 0.3 |
| Evaluation | Appearance of Plating | | ○ | Δ | Δ | ○ | ○ | Δ | Δ | x | Δ | ○ |
| | Reflectance (450 nm) | | 84.2 | 82.3 | 83.1 | 76.8 | 77.0 | 81.5 | 84.1 | 91.8 | 26.4 | 37.2 |
| | Reflectance after Thermal Aging | | 57.5 | 52.8 | 58.8 | 51.1 | 50.4 | 59.1 | 57.7 | 59.7 | 14.1 | 14.5 |
| | Solder Heat Resistance | | ○ | ○ | Δ | ○ | ○ | x | x | ○ | ○ | ○ |

TABLE 3

|  |  | Example 18 | Example 19 | Example 20 | Example 21 |
|---|---|---|---|---|---|
| Thermoplastic resin | PAP10 | 100 | 100 | 100 | 100 |
| Glass filler | GF | 18.7 | 19.5 | 48.6 | 38.9 |
| LSD Additive | CP5C | 7.5 | 11.7 | 11.7 | 11.7 |
| Titanium oxide | CR-63 | 56.2 | 58.4 | 29.2 | 38.9 |
|  | Talc | 1.9 | 1.9 | 1.9 | 1.9 |
|  | Heat stabilizer | 1.9 | 1.9 | 1.9 | 1.9 |
| Alkali | Ca(OH)$_2$ | 0.6 | 0.6 | 0.6 | 0.6 |
|  | Mold releasing agent | 0.6 | 0.6 | 0.6 | 0.6 |
| Evaluation | Appearance of Plating | ○ | ○ | ○ | ○ |
|  | Reflectance (450 nm) | 89.8 | 88.2 | 85.0 | 86.4 |
|  | Reflectance after Thermal Aging | 75.4 | 73.4 | 63.4 | 65.8 |
|  | Solder Heat Resistance | ○ | ○ | ○ | ○ |

As is obvious from the results shown above, the thermoplastic resin composition of the present invention were proved to be excellent in all of the appearance of plating, reflectance, reflectance after thermal aging, and solder heat resistance (Examples 1 to 19). In particular, it was confirmed that, by using the LDS additive which contains antimony and tin as an LDS additive, the reflectance was further improved (Examples 1 to 6, 8 to 21).

The invention claimed is:

1. A thermoplastic resin composition comprising:
per (A) 100 parts by weight of a crystalline thermoplastic resin having a melting point, measured by differential scanning calorimetry (DSC) at a heating rate of 10° C./min, of 250° C. or above;
(B) 10 to 80 parts by weight of a glass filler;
(C) 1 to 30 parts by weight of a laser direct structuring additive having a reflectance at 450 nm of 25% or above; and
(D) 20 to 150 parts by weight of titanium oxide,
wherein the crystalline thermoplastic resin is a polyamide resin, the polyamide resin contains a diamine structural unit and a dicarboxylic acid structural unit, and 50 mol % or more of the diamine structural unit is derived from xylylene diamine.

2. The thermoplastic resin composition of claim 1, wherein the (C) laser direct structuring additive contains antimony and tin, with a content of tin larger than that of antimony.

3. The thermoplastic resin composition of claim 1, wherein the (C) laser direct structuring additive contains antimony and tin oxide, with a content of tin larger than that of antimony.

4. The thermoplastic resin composition of claim 1, wherein the (C) laser direct structuring additive has a core composed of a composition having a reflectance at 450 nm of 50% or above, and has a coating composed of a composition containing antimony and tin, with a content of tin larger than that of antimony, formed on a part of, or over the entire surface of the core.

5. The thermoplastic resin composition of claim 4, wherein the composition composing the core contains a metal oxide.

6. The thermoplastic resin composition of claim 1, further comprising 1 to 20 parts by weight of talc per 100 parts by weight of the thermoplastic resin composition.

7. The thermoplastic resin composition of claim 1, wherein the (D) titanium oxide has an average primary particle size of 1 μm or smaller.

8. The thermoplastic resin composition of claim 1, wherein the (D) titanium oxide has the rutile structure.

9. The thermoplastic resin composition of claim 1, wherein the (B) glass filler is at least one material selected from chopped fiber, milled fiber, flake, bead and balloon.

10. The thermoplastic resin composition of claim 1, wherein the (B) glass filler is E-glass.

11. The thermoplastic resin composition of claim 1, further comprising 0.01 to 5 parts by weight of an organic or/and inorganic heat stabilizer per 100 parts by weight of the thermoplastic resin composition.

12. The thermoplastic resin composition of claim 11, wherein the organic or/and inorganic heat stabilizer is substantially free from copper element.

13. The thermoplastic resin composition of claim 1, further comprising 0.01 to 5 parts by weight of an organic or/and inorganic light stabilizer per 100 parts by weight of the thermoplastic resin composition.

14. The thermoplastic resin composition of claim 1, wherein the (A) crystalline thermoplastic resin contains in a molecule thereof an aromatic ring, with a ratio of carbon atoms composing the aromatic ring relative to the polyamide resin molecule of 30 mol % or more.

15. A resin article obtained by molding the thermoplastic composition described in claim 1.

16. The resin article of claim 15, further comprising a plated layer formed on the surface of the resin article.

17. A light emitting diode comprising the resin article claim 15.

18. The light emitting diode of claim 17, wherein the resin article functions as a reflective plate.

19. The resin article of claim 16,
wherein the plated layer performs as an electro-conductive circuit.

20. A method of manufacturing a resin article with a plated layer, comprising irradiating the surface of the resin article, obtained by molding the thermoplastic resin composition described in claim 1, with a laser, and then applying a metal to form the plated layer.

21. The method of manufacturing a resin article with a plated layer of claim 20, wherein the plated layer contains at least one kind selected from, copper, nickel, silver and gold.

22. The method of manufacturing a resin article with a plated layer of claim 21, wherein the plated layer is used in the form of multi-layered structure.

23. A method of manufacturing a part for a light emitting diode device having an electro-conductive circuit, comprising the method of manufacturing a resin article with a plated layer described in claim 20.

24. A thermoplastic resin composition comprising:
per (A) 100 parts by weight of a crystalline thermoplastic resin having a melting point, measured by differential scanning calorimetry (DSC) at a heating rate of 10° C./min, of 250° C. or above;
(B) 10 to 80 parts by weight of a glass filler;
(C) 1 to 30 parts by weight of a laser direct structuring additive having a reflectance at 450 nm of 25% or above; and
(D) 20 to 150 parts by weight of titanium oxide,
wherein the (C) laser direct structuring additive contains antimony and tin.

* * * * *